(12) United States Patent
Willis

(10) Patent No.: US 7,698,607 B2
(45) Date of Patent: Apr. 13, 2010

(54) REPAIRING MICRODISPLAY FRAME BUFFERS

(75) Inventor: Thomas E. Willis, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 926 days.

(21) Appl. No.: 10/868,057

(22) Filed: Jun. 15, 2004

(65) Prior Publication Data

US 2005/0278582 A1    Dec. 15, 2005

(51) Int. Cl.
G11C 29/00 (2006.01)
G06F 11/00 (2006.01)
H04N 9/64 (2006.01)

(52) U.S. Cl. .................. 714/710; 714/723; 714/53; 348/246; 365/200

(58) Field of Classification Search .................. None
See application file for complete search history.

(56) References Cited

U.S. PATENT DOCUMENTS

| | | | | |
|---|---|---|---|---|
| 4,734,774 A | * | 3/1988 | Skaggs et al. | 348/246 |
| 5,784,040 A | * | 7/1998 | Kobayashi et al. | 345/89 |
| 6,445,602 B1 | * | 9/2002 | Kokudo et al. | 365/45 |
| 6,456,339 B1 | * | 9/2002 | Surati et al. | 348/745 |
| 6,518,945 B1 | * | 2/2003 | Pinkham | 345/92 |
| 6,564,346 B1 | * | 5/2003 | Vollrath et al. | 714/723 |
| 6,934,208 B2 | * | 8/2005 | Thompson et al. | 365/203 |
| 2004/0096125 A1 | * | 5/2004 | Alderson et al. | 382/312 |
| 2005/0024981 A1 | * | 2/2005 | Bateman et al. | 365/232 |
| 2006/0176401 A1 | * | 8/2006 | Turchetta | 348/571 |

* cited by examiner

*Primary Examiner*—Kevin L Ellis
*Assistant Examiner*—Guerrier Merant
(74) *Attorney, Agent, or Firm*—Trop, Pruner & Hu, P.C.

(57) ABSTRACT

A frame buffer for a microdisplay may be implemented with a repair algorithm that achieves desired uniformity in the frame buffer. Because the frame buffer and the display are tightly coupled, it is desirable to avoid providing unnecessary redundant elements which break up the uniformity of the overall integrated circuit. To this end, when a cell in the frame buffer is defective, a system to automatically address in its place an adjacent cell may be implemented. In one embodiment, control logic may address a column multiplexer to select an adjacent cell in an adjacent column in the same row to provide information in place of the defective cell in the frame buffer.

13 Claims, 3 Drawing Sheets

REPAIRING MICRODISPLAY FRAME BUFFERS

BACKGROUND

This invention relates generally to microdisplays for displaying information in association with processor-based systems.

A microdisplay is a relatively small display which can be viewed directly, as in a head mounted display, or enlarged by using projection systems, for example. Commonly, microdisplays are less than four centimeters measured diagonally.

Digital microdisplays may contain integrated frame buffers that hold the pixel data for the image being displayed. In order to get a high quality image, a large number of pixels may be utilized. Displaying a large number of pixels requires a relatively large frame buffer to store the data being displayed. The yield of an integrated circuit, which includes both the pixel array and the frame buffer, may be limited by the yield of memory that implements the frame buffer.

Thus, the memory may contain a redundancy repair mechanism to allow the microdisplay to tolerate a certain number of failures during fabrication of the frame buffer. Generally, if bad locations are formed in the frame buffer, the entire frame buffer need not be disposed of because redundant memory blocks may be utilized to replace blocks that have damaged memory location.

Traditional redundancy repair schemes add additional redundant memory to the array that can be swapped in place of the failing elements. Since the overall physical organization of the memory is not relevant to its operation in traditional memories, there are no problems inserting redundant blocks or structures.

However, in a microdisplay, the memory may be tightly coupled to the pixel array that forms the display. In such microdisplays, the physical layout of the bits is constrained by the size and location of the pixels. That is, the memory for a pixel at some location may be adjacent to the memory for a pixel at another location.

Thus, there is a need to enable repair of defective frame buffers in microdisplays.

DETAILED DESCRIPTION

Figure 1:
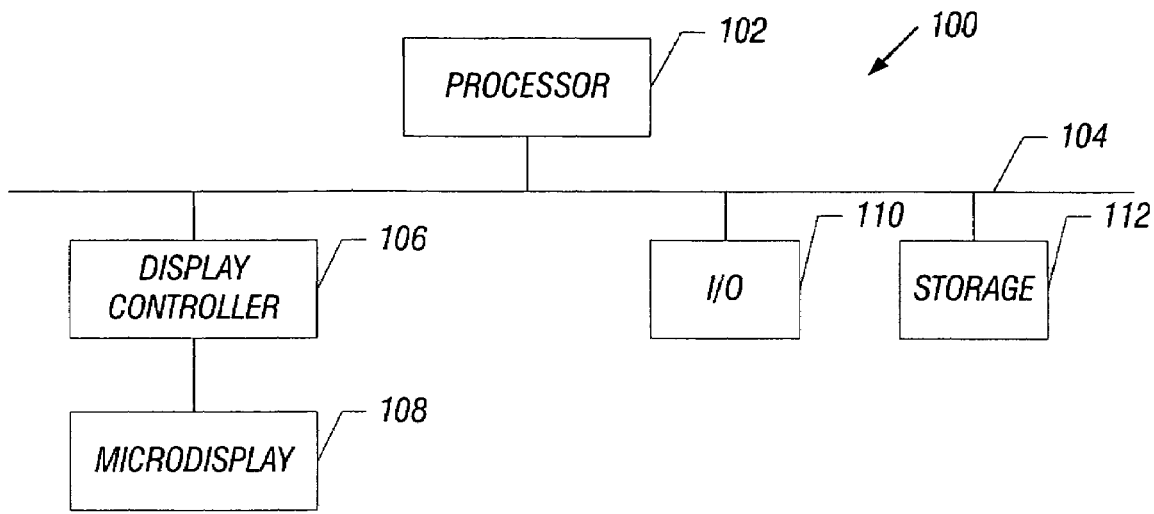
FIG. 1 is a schematic depiction of a system in accordance with one embodiment of the present invention.

Referring to FIG. 1, a processor-based system 100 may include a microdisplay 108. The system 100 may, for example, be a projection display or a head mounted display system. The microdisplay 108 may be coupled by a display controller 106 to a bus 104. The bus 104, in one architecture, may be coupled to an input/output device 110 and a storage 112. The storage 112 may include dynamic random access memory in one embodiment. The bus 104 may also be coupled to a processor 102. While a simple architecture for a processor-based system 100 is illustrated, the present invention is in no way limited to any particular architecture.

Figure 2:
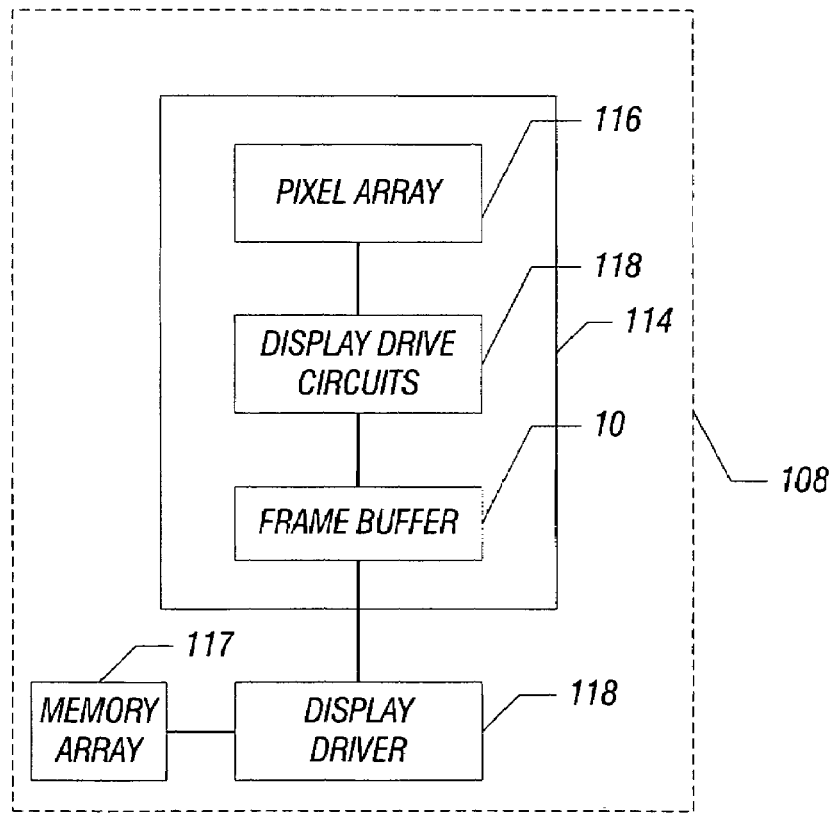
FIG. 2 is a schematic depiction of a microdisplay in accordance with one embodiment of the present invention.

Referring to FIG. 2, the microdisplay 108, in one embodiment, may include a display driver 118 coupled to a memory array 116 and an integrated circuit 114. In one embodiment, the integrated circuit 114 includes a frame buffer 10 coupled to display drive circuits 118, in turn coupled to a pixel array 116. The pixel array 116 and the frame buffer 10 may be organized in the same fashion so that each pixel in the array 116 corresponds to similarly located memory location in the frame buffer 10.

Figure 3:
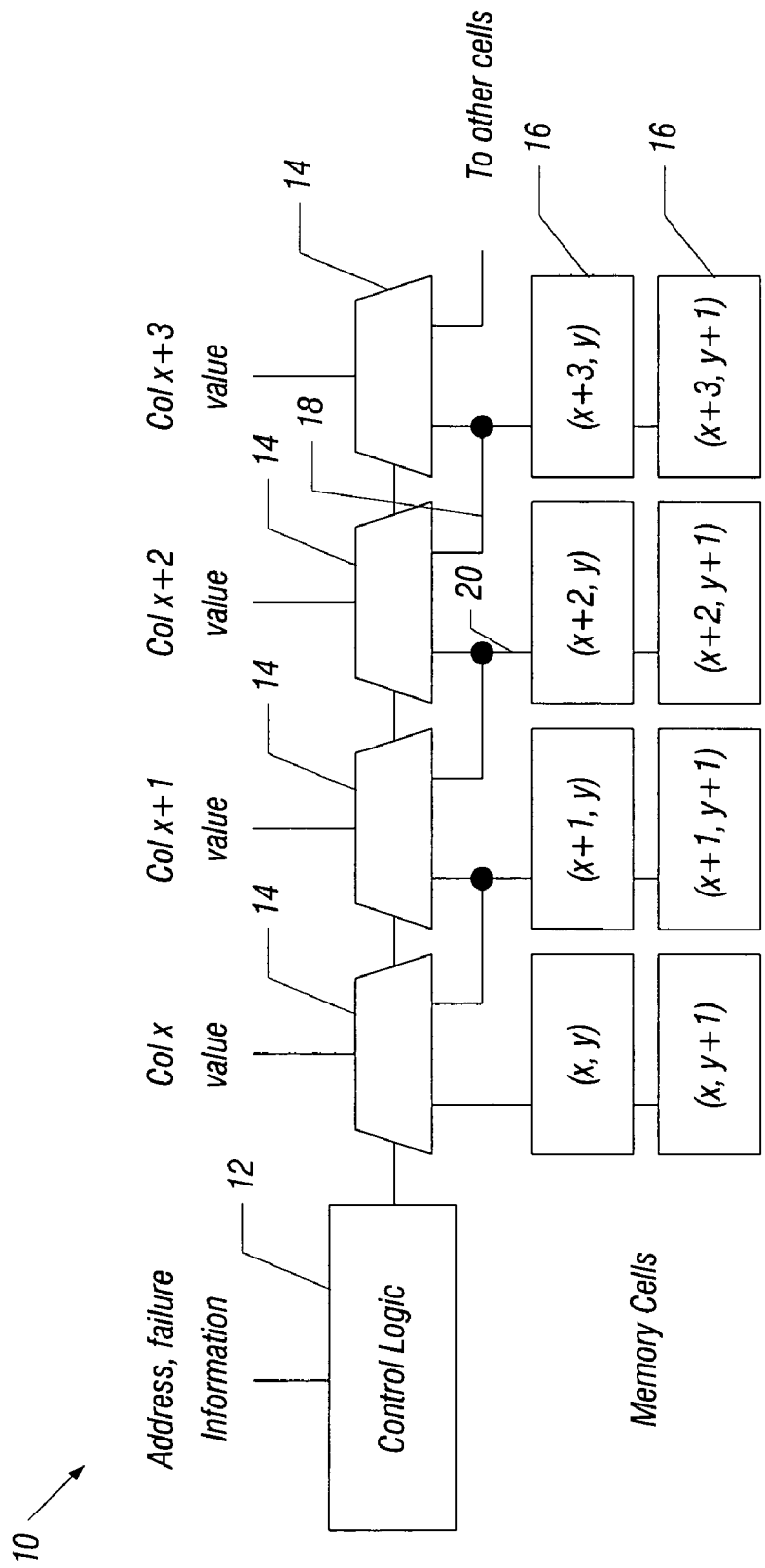
FIG. 3 is a schematic depiction of a frame buffer in one embodiment of the present invention.

Referring to FIG. 3, the frame buffer 10 of an integrated microdisplay 108 may include control logic 12 and a series of multiplexers 14. The multiplexers 14 receive control signals from the control logic 12 and column values from an appropriate address buffer (not shown). The control logic 12 may receive address and failure information. Generally, a column of memory cells or bits is located below each multiplexer 14. For example, column X may include memory cells (X, Y), (X, Y+1) and so on. Similarly, column X+1 may be coupled to a multiplexer 14 which, in turn, is coupled to a column including memory cells (X+1, Y), (X+1, Y+1) and so on.

The cells in the frame buffer 10 are arranged in an addressable array made up of two sets of generally transverse lines. One set may be considered column lines and the other set may be considered as row lines. Each cell can be accessed by addressing a particular line in each set of lines.

Referring, for example, to the multiplexer 14 for column X+2, the multiplexer 14 may be coupled to its column by a line 20. That multiplexer 14 is also coupled by a line 18 to an adjacent column X+3.

Generally speaking, adjacent pixels in an image tend to have similar values in typical images. That is, if a pixel at location (X, Y) has an intensity value of 50, it is likely that a pixel at location (X+1, Y) has a value around 50 as well.

A failure of the pixel, for example at (X+2, Y) in column (X+2), can be remedied by using a value of an adjacent pixel, such as the pixel (X+3, Y) in the adjacent column (X+3), to provide the value for the failing pixel. In many cases, the replacement will not be noticeable by the user. Since the value that is replaced may either be a color component value, an intermediate value that applied to the modulation of the pixel, or other such pixel specific information that represents a pixel value, it is generally the case that adjacent pixels will have sufficiently similar values that the replacement is not noticeable.

While an embodiment is illustrated in which a defective pixel in one row is substituted for using the value in the same row 16 in the next column, the same scheme can be implemented by replacing a defective cell in one row with a good cell in an adjacent row.

Thus, the control logic 12 may select an adjacent column, in one embodiment of the present invention, when a cell at a particular row and column address is known to be defective. In other words, when normally the cell (X+2, Y) would be addressed, when the control logic 12 has information that that cell is defective, the multiplexer 14 accesses the value from the adjacent column, same row (X+3, Y).

Each multiplexer 14 is controlled or programmed by the control logic 12 based on the information the control logic 12 receives about bad cells. This information may be programmed into the microdisplay 108 based on post-fabrication testing. Thus, when a cell in a column is bad, the replacement information is accessed over the line 18. When the addressed cell is good, it is accessed via a line 20 by an overlying multiplexer 14. Thus, some cells may be accessed two or more times to refresh the display.

Figure 4:
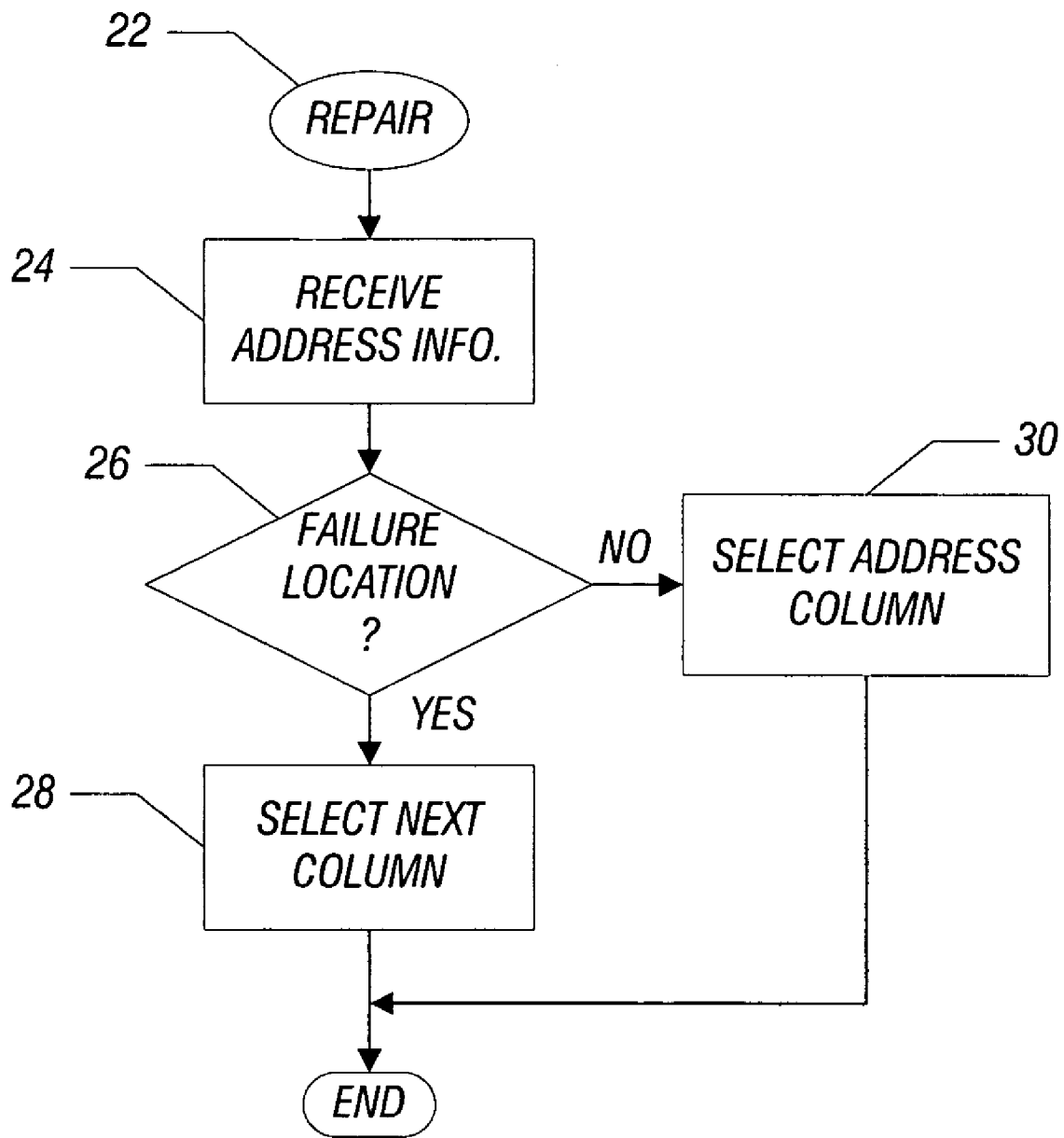
FIG. 4 is a flow chart for one embodiment of the present invention.

Referring to FIG. 4, in accordance with one embodiment of the present invention, a repair algorithm 22 may be implemented in hardware or software. Initially, the address information with the defective cells identified is received as indicated in block 24. The failure location is determined as indicated in diamond 26. If an address location is a failure location, a corresponding cell in a next column, same row, may be addressed as indicated in block 28. In other words, the information stored on the adjacent cell is used in place of the information stored on the address cell. If there is no failure, then an addressed cell is accessed as indicated in block 30.

In some embodiments of the present invention, the coupling that is desirable in a microdisplay between the pixel locations and the memory locations can be achieved without sacrificing the ability to repair the memory. In some embodiments of the present invention, this results in better uniformity than would be the case with redundant blocks or redundant cells.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   determining that an addressed array cell, in a microdisplay frame buffer, is defective; and, if the addressed array cell is defective, then both:
   enabling information from an addressable, non-redundant array cell adjacent to said defective cell to be used in place of the information from the defective cell; and
   enabling the information from the adjacent cell to also be used when the adjacent cell is addressed.

2. The method of claim 1 including providing a frame buffer with a memory array including a first and second set of lines of memory cells, said first set of lines being generally transverse to said second set of lines.

3. The method of claim 2 including enabling a multiplexer to access a cell in either of two lines of said first set of lines.

4. The method of claim 3 including enabling accessing a cell in one of said first set of lines if said cell is not defective and, if said cell is defective, causing said multiplexer to access an adjacent cell in another of said first set of lines.

5. The method of claim 2 including enabling a first cell on one of said first and one of said second sets of lines to be addressed through a multiplexer and enabling said multiplexer to address said first cell if said first cell is not defective and to address, in place of said first cell, a second cell in an adjacent line when said first cell is defective.

6. A method comprising:
   forming an array of non-redundant memory cells to act as a frame buffer; and
   enabling a value for one of said cells to be used as the value for said one cell and another of said cells when said another cell is defective, without providing redundant cells in said frame buffer.

7. The method of claim 6 accessing another cell when the one cell is defective.

8. The method of claim 6 including providing multiplexers on columns of memory cells in said frame buffer, and enabling a multiplexer to access said another cell in an adjacent column when the one cell is defective.

9. A microdisplay comprising:
   a pixel array;
   a frame buffer coupled to said pixel array, said frame buffer including an array of non-redundant memory cells arranged in rows and columns and a multiplexer coupled to at least two of said columns, said multiplexer to use information from a non-defective, adjacent cell of said array as the information displayed on another cell of said array when said another cell is defective, wherein the information from said non-defective, adjacent cell is also used as the information displayed on said non-defective, adjacent cell when said another cell is defective.

10. The microdisplay of claim 9 wherein said frame buffer includes no redundant cells.

11. The microdisplay of claim 9 including control logic to replace a value of a defective cell with a value of another cell adjacent said defective cell.

12. The microdisplay of claim 9 including drive circuits coupled between said frame buffer and said pixel array.

13. The microdisplay of claim 9 wherein said memory array includes a plurality of memory cells and said pixel array includes a plurality of pixel array cells, one memory cell being positioned adjacent its corresponding pixel array cell.

\* \* \* \* \*